(12) United States Patent
Noguchi et al.

(10) Patent No.: US 12,288,577 B2
(45) Date of Patent: Apr. 29, 2025

(54) SENSING AMPLIFIER, METHOD AND CONTROLLER FOR SENSING MEMORY CELL

(71) Applicant: Taiwan Semiconductor Manufacturing Company, Ltd., Hsinchu (TW)

(72) Inventors: Hiroki Noguchi, Hsinchu (TW); Ku-Feng Lin, New Taipei (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 208 days.

(21) Appl. No.: 18/177,749

(22) Filed: Mar. 2, 2023

(65) Prior Publication Data

US 2023/0206963 A1    Jun. 29, 2023

Related U.S. Application Data

(60) Continuation of application No. 17/731,248, filed on Apr. 27, 2022, now Pat. No. 11,631,440, which is a division of application No. 16/925,295, filed on Jul. 9, 2020, now Pat. No. 11,386,936.

(60) Provisional application No. 62/982,071, filed on Feb. 27, 2020.

(51) Int. Cl.
*G11C 7/14*         (2006.01)
*G11C 7/06*         (2006.01)

(52) U.S. Cl.
CPC .................... *G11C 7/062* (2013.01)

(58) Field of Classification Search
CPC .............. G11C 7/14; G11C 7/062; G11C 7/06
See application file for complete search history.

(56) References Cited

U.S. PATENT DOCUMENTS

| 9,767,919 | B1* | 9/2017 | He ........................ G11C 29/38 |
| 2006/0126374 | A1* | 6/2006 | Waller ................... H10B 12/00 |
| | | | 365/149 |
| 2006/0164898 | A1* | 7/2006 | Pio ........................ G11C 29/026 |
| | | | 365/210.1 |
| 2007/0064489 | A1* | 3/2007 | Bauser ................ G11C 11/4099 |
| | | | 365/185.21 |
| 2007/0159904 | A1* | 7/2007 | Tran ........................ G11C 16/24 |
| | | | 365/207 |
| 2016/0093352 | A1* | 3/2016 | Jung .................... G11C 29/021 |
| | | | 365/158 |

(Continued)

*Primary Examiner* — Tuan T Nguyen
(74) *Attorney, Agent, or Firm* — JCIPRNET

(57) ABSTRACT

A sensing amplifier, coupled to at least one memory cell, includes an output terminal and a reference terminal, a multiplexer circuit, and a plurality of reference cells having equal value. An output terminal of the multiplexer circuit is coupled to the reference terminal of the sensing amplifier. Each of the reference cell is coupled to each input node of the multiplexer circuit. The multiplexer circuit is controlled by a control signal to select one of the reference cells as a selected reference cell to couple to the reference terminal of the sensing amplifier when each read operation to the at least one memory cell is performed. The plurality of reference cells are selected sequentially and repeatedly, and the one of the reference cells is selected for one read operation to the at least one memory cell.

20 Claims, 4 Drawing Sheets

(56) References Cited

U.S. PATENT DOCUMENTS

2020/0043554 A1\*  2/2020  Moriwaki .............. G11C 15/04
2022/0051704 A1\*  2/2022  Gupta .................. G11C 7/1039

\* cited by examiner

SENSING AMPLIFIER, METHOD AND CONTROLLER FOR SENSING MEMORY CELL

CROSS-REFERENCE TO RELATED APPLICATION

This application is a continuation application of and claims the priority benefit of a prior application Ser. No. 17/731,248 filed on Apr. 27, 2022. The prior application Ser. No. 17/731,248 is a divisional application of and claims the priority benefit of U.S. application Ser. No. 16/925,295, filed on Jul. 9, 2020. The prior application Ser. No. 16/925,295 claims the priority benefit of U.S. provisional application Ser. No. 62/982,071, filed on Feb. 27, 2020. The entirety of the above-mentioned patent application is hereby incorporated by reference herein and made a part of this specification.

BACKGROUND

The disclosure relates to a technology for sensing amplifier of a memory device, and more particularly a memory device, a sensing amplifier, and a method for sensing a memory cell with wear levelling of a plurality of the reference cell in the sensing amplifier.

Most of the memory device utilizing reference cells in sense amplifiers (SAs) for a read operation, due to small read sensing window for each of memory cells in the memory device. How to design a structure of sense amplifiers (SA) in the memory device is one of the challenges for the reading function of the memory device. Each column of memory array has one sense amplifier with a reference cell, and the sense amplifier uses this reference cell to read the memory cell located in the same column order with the corresponding reference cell. As a result, during the read operation of the memory device, although the memory cell stores the data correctly, but the data read by the sense amplifier may be flipped because of an error in the reference cell. The error may be caused by a large number of access times to the reference cell so that the reference cell encounters a read endurance and reliability issue. In other words, due to the reading times of each column of a memory array and the deviation of the semiconductor process, each reference cell of the sense amplifier may have a slight difference.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
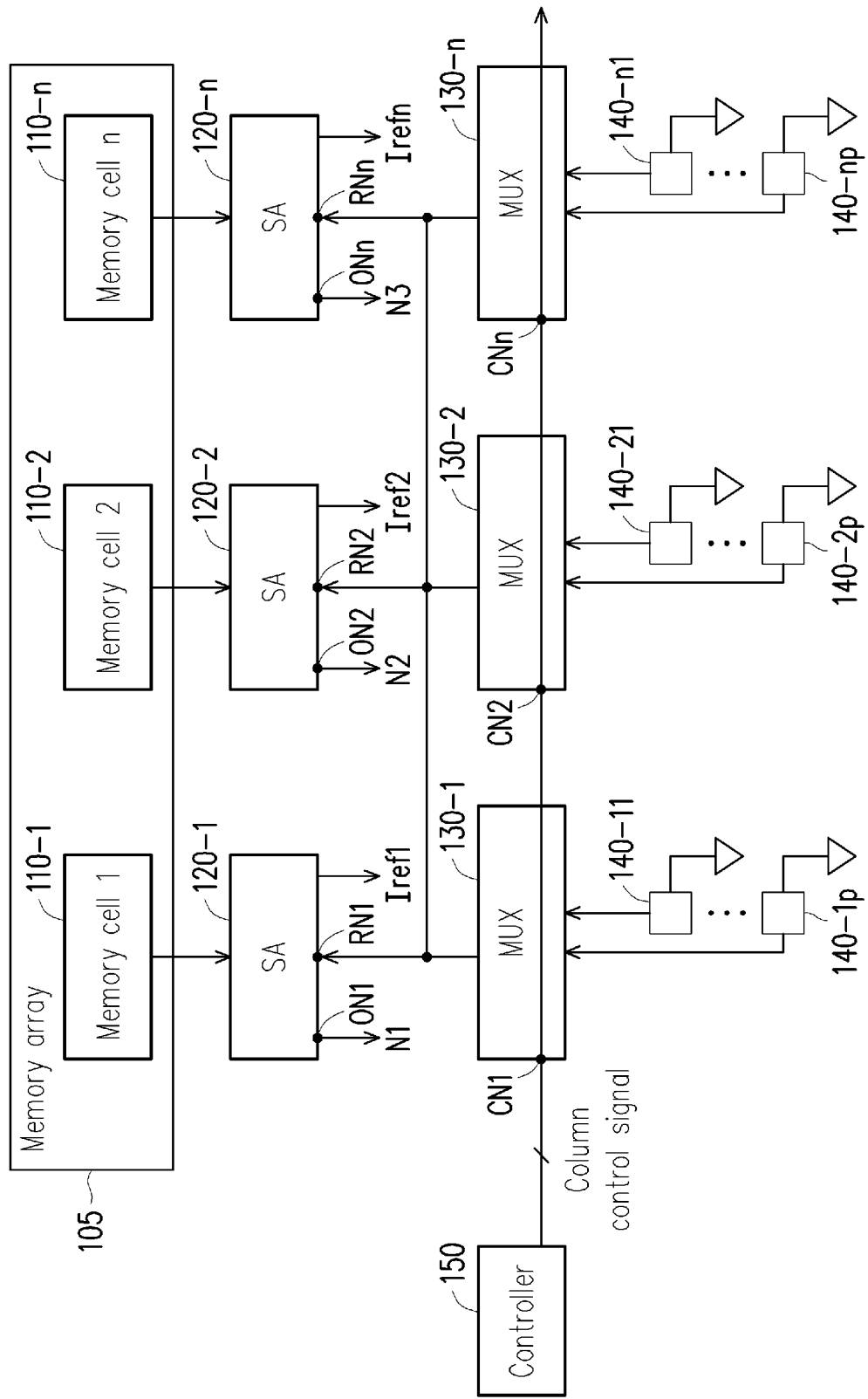
FIG. 1 illustrates a detailed block diagram of a structure of sense amplifier with a plurality of the reference cells selected via a multiplexer by a column control signal generated by a controller according to an embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a detailed block diagram of a structure of sense amplifier with a plurality of the reference cells selected via a multiplexer by a column control signal generated by a controller according to an embodiment of the disclosure. The memory device 100 with wear leveling of reference cell may be implemented as a storage or a consumer electronic device with memory array. In the embodiment, the memory device 100 may be a flash memory device or a DRAM device.

Referring to FIG. 1, the memory device 100 includes at least one memory cell (i.e., memory cells 110-1 to 110-$n$) in a memory array 105, at least one sensing amplifier SA (i.e., sensing amplifier 120-1 to 120-$n$), at least one multiplexer circuit MUX (i.e., multiplexer circuit 130-1 to 130-$n$), a plurality of reference cells (i.e., reference cells 140-11 to 140-1$p$ with the column of the memory cell 110-1), and a controller 150. The number of n or p is a positive integer.

In the embodiment of FIG. 1, the memory array 105 has n columns of the memory cells, the plurality of the MUX 130-1 to 130-$n$ located in the same row order, and the memory cell 110-1 is represented as one the memory cells in the column. In other words, it has a plurality of memory cells (i.e., the memory cell 110-1), a SA (i.e., the SA 120-1), a MUX (i.e., the MUX 130-1), and a plurality of reference cells (i.e., the reference cells 140-11 to 140-1$p$) in each column of the memory device 100. The SA 120-1 is coupled to the memory cell 110-1, and the SA 120-1 includes an output terminal ON1 and a reference terminal RN1. The output terminal of the MUX 130-1 is coupled to the reference terminal RN1 of the SA 120-1, and each of the reference cells 140-11 to 140-1*p* is coupled to each input nodes of the MUX 130-1. The controller 150 is coupled to a control terminal CN1 of the MUX 130-1.

The controller 150 controls the MUX 130-1 to select one of the reference cells 140-11 to 140-1*p* as an selected reference cell to couple to the reference terminal RN1 of the SA 120-1 sequentially and repeatedly in response to each read operation to the at least one memory cell (i.e., memory cells 110-1 to 110-*n*) is performed. In detail, the controller 150 may be a processor, field programmable gate array (FPGA), application specific integrated circuit (ASIC), or any integrated programmable on chip. The controller 150 may has a plurality of output terminals, each output terminals is coupled to the selector terminal of each multiplexer (i.e., MUX 130-1-MUX 130-*n*). The controller 150 generates at least one column control signal to select one reference cell among the plurality of the reference cells arranged in a column order. For example, the controller 150 generates first column control signal to select one reference cell 140-11 among the plurality of the reference cells 140-11 to 140-1*p* via the selector terminal CN 1 of multiplexer MUX 130-1. The reference cell 140-11 is located in the first row of the plurality of the reference cells 140-11 to 140-1*p* arranged in a column order. As a result, the controller 150 is able to select, by a column control signal, one the reference cell among the plurality of reference cells 140-11 to 140-1*p* arranged in a column order via the MUX 130-1. For example, during first read operation, the controller 150 selects the reference cell 140-11 by first column control signal. And then, during second read operation, the controller 150 selects the reference cell 140-12 by second column control signal. And then, during $p^{th}$ read operation, the controller 150 selects the reference cell 140-1*p* by $p^{th}$ column control signal. And then, the process may be repeated by selecting the reference cell 140-11 in the next read operation. In other word, simply say that the reference cells 140-11 to 140-1*p* are able to be used sequentially and repeatedly during read operation. Thus, the reference cells 140-11 to 140-1*p* are able to avoid stress or large amount of access in response to read operation, and equality of the reference cells 140-11 to 140-1*p* values are able to be maintained.

In some embodiments of the disclosure, the controller 150 controls the MUX 130-2 to select one of the reference cells 140-21 to 140-2*p* as an selected reference cell to couple to the reference terminal RN2 of the SA 120-2 sequentially and repeatedly in response to each read operation to the at least one memory cell (i.e., memory cells 110-1 to 110-*n*) is performed. The controller 150 generates second column control signal to select one reference cell 140-21 among the plurality of the reference cells 140-21 to 140-2*p* via the selector terminal CN 2 of multiplexer MUX 130-2. As a result, the reference cells 140-21 to 140-2*p* are able to be used sequentially and repeatedly during read operation. Thus, the reference cells 140-21 to 140-2*p* are able to avoid stress or large amount of access in response to read operation, and equality of the reference cells 140-21 to 140-2*p* values are able to be maintained.

In some embodiments of the disclosure, the MUX 130-1 performs selection from the input terminal of the MUX 130-1 to the output terminal of the MUX 130-1 according to the column control signal from the controller 150. The MUX 130-2 performs selection from the input terminal of the MUX 130-2 to the output terminal of the MUX 130-2 according to the column control signal from the controller 150. The MUX 130-*n* performs selection from the input terminal of the MUX 130-*n* to the output terminal of the MUX 130-*n* according to the column control signal from the controller 150. The input terminal of the MUX 130-1 is coupled to the reference cells 140-11 to 140-1*p*. The selector terminal CN 1 of the MUX 130-1, the selector terminal CN 2 of the MUX 130-2, and the selector terminal CN n of the MUX 130-*n* are coupled to the controller 150. The output terminal of the MUX 130-1 is coupled to the input terminal RN1 of the SA 120-1, the output terminal of the MUX 130-2 is coupled to the input terminal RN2 of the SA 120-2, and the output terminal of the MUX 130-*n* is coupled to the input terminal RNn of the SA 120-*n*. On the other hand, the reference terminals RN1 to RNn of the SA 120-1 to 120-*n* are coupled to each other. For example, the reference terminal RN1 of the MUX 130-1 is coupled to the reference terminal RN2 of the MUX 130-2.

Hence, according to the parallel structure of the selected reference cells controlled by the controller 150, the SA 120-1 to 120-*n* have same reference voltage. For example, the controller 150 selects the reference cell 140-11 among the plurality of the reference cells 140-11 to 140-1*p* via the MUX 130-1. Since the output terminal of the MUX 130-1 is coupled to the reference terminal RN1 of the SA 120-1 to the reference terminal RNn of the SA 120-*n*, the SA 120-1 to 120-*n* utilizes the reference cell 140-11 as a common reference cell during read operation. For another example, the controller 150 selects the reference cell 140-21 among the plurality of the reference cells 140-21 to 140-2*p* via the MUX 130-2. Since the output terminal of the MUX 130-2 is coupled to the reference terminal RN1 of the SA 120-1 to the reference terminal RNn of the SA 120-*n*, the SA 120-1 to 120-*n* utilizes the reference cell 140-21 as a common reference cell during read operation. For another example, the controller 150 selects the reference cell 140-11 among the plurality of the reference cells 140-11 to 140-1*p* via the MUX 130-1 and selects the reference cell 140-21 among the plurality of the reference cells 140-21 to 140-2*p* via the MUX 130-2. Since the output terminal of the MUX 130-1 and the output terminal of the MUX 130-2 are coupled to the reference terminal RN1 of the SA 120-1 to the reference terminal RNn of the SA 120-*n*, the SA 120-1 to 120-*n* utilizes the reference cells 140-11 and 140-21 as common reference cells during read operation. In condition which the controller 150 selects more than one reference cell, in which each reference cell is selected among the plurality of the reference cells connected to the same multiplexer, values of the common reference cells are averaged. For instance, if the selected reference cells 140-11 and 140-21 have values A and B respectively, the average value may be (A+B)/2. Thus, by applying this configuration, the error reading caused by the slightly difference value of each reference cells is able to be avoid by averaging the values of the selected reference cells.

In some embodiment of the disclosure, the SA 120-1 to 120-*n* may be comparators. The SA 120-1 to 120-*n* may be implemented by the combination of transistor, resistor, and capacitor. The SA 120-1 may perform comparison between at least one memory cell 110-1 and one reference cell 140-11 among the plurality of reference cells 140-11 to 140-1*p* selected by the controller 150 via the MU 130-1. The SA 120-2 may perform comparison between at least one memory cell 110-2 and one reference cell 140-21 among the plurality of reference cells 140-21 to 140-2*p* selected by the controller 150 via the MU 130-1. The SA 120-1 may perform comparison between at least one memory cell 110-1 and more than one reference cells. Each reference cells may be selected from one reference 140-11 among the plurality of the reference cells 140-11 to 140-1*p* via the MU 130-1 and one reference 140-21 among the plurality of the reference cells 140-21 to 140-2*p* via the MU 130-2. By applying various combination as mentioned above, the plurality of the reference cells 140-11 to 140-1*p*, the plurality of the reference cells 140-21 to 140-2*p*, and the plurality of the reference cells 140-*n*1 to 140-*np* are able to be accessed equally and repeatedly in order to avoid the stress or large amount of access of the memory cells during read operation. Thus, the life cycle of the memory device is able to be optimized.

Figure 2:
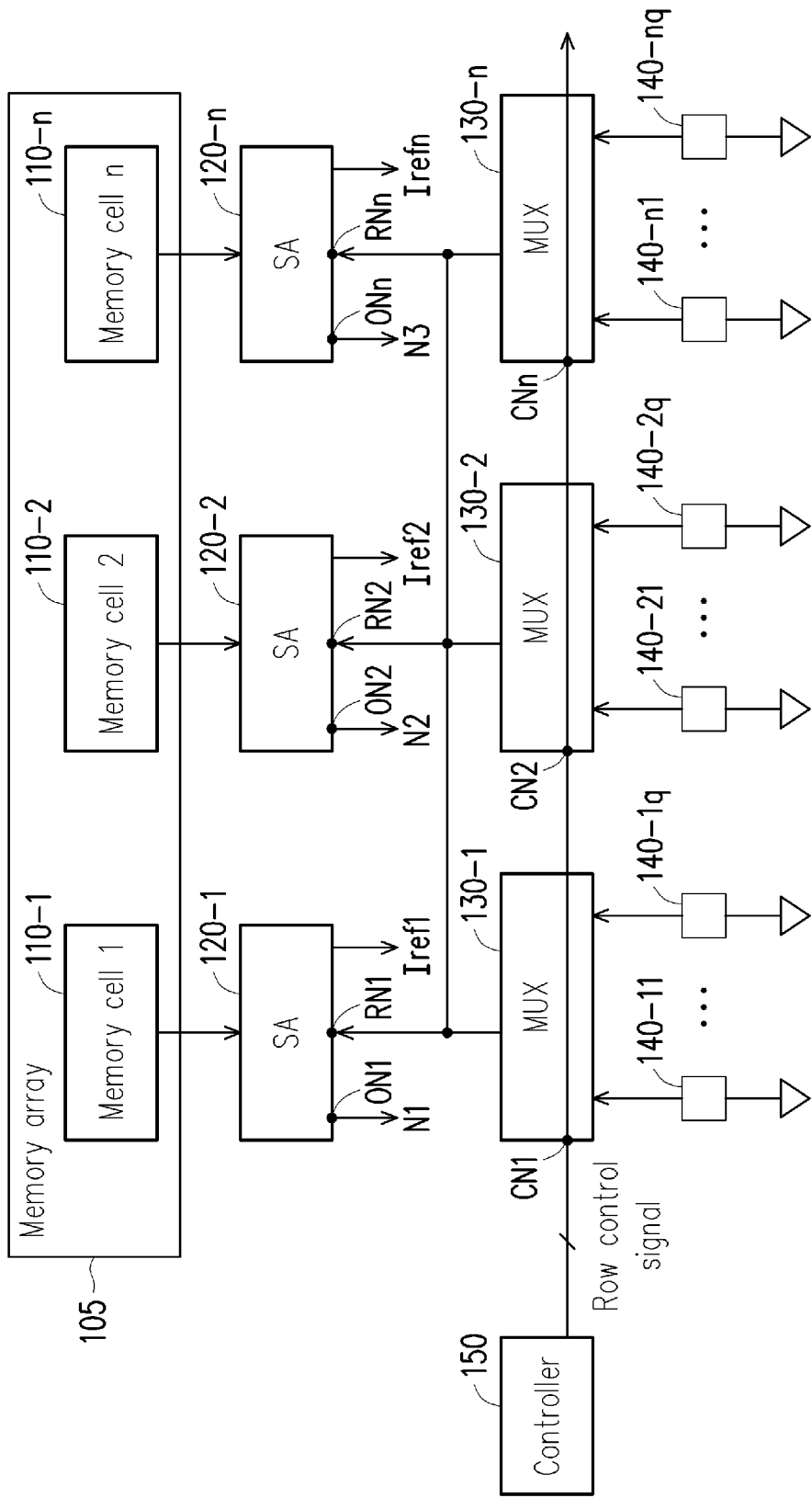
FIG. 2 illustrates a detailed block diagram of a structure of sense amplifier with a plurality of the reference cells selected via a multiplexer by a row control signal generated by a controller according to an embodiment of the disclosure.

FIG. 2 illustrates a detailed block diagram of a structure of sense amplifier with a plurality of the reference cells selected via a multiplexer by a row control signal generated by a controller according to the embodiment of the disclosure.

In the embodiment of FIG. 1, the plurality of the reference cells is arranged in a column. In the embodiment of FIG. 2, the plurality of the reference cells is arranged in a row.

In this exemplary embodiment, the controller 150 controls the MUX 130-1 to select one of the reference cells 140-11 to 140-1*q* as an selected reference cell to couple to the reference terminal RN1 of the SA 120-1 sequentially and repeatedly in response to each read operation to the at least one memory cell (i.e., memory cells 110-1 to 110-*n*) is performed. The controller 150 may has a plurality of output terminals, each output terminals is coupled to the selector terminal of each multiplexer (i.e., MUX 130-1-MUX 130-*n*). The controller 150 generates at least one row control signal to select one reference cell among the plurality of the reference cells arranged in a row order. For example, the controller 150 generates first row control signal to select one reference cell 140-11 among the plurality of the reference cells 140-11 to 140-1*q* via the selector terminal CN 1 of multiplexer MUX 130-1. The reference cell 140-11 is located in the first column of the plurality of the reference cells 140-11 to 140-1*q* arranged in a row order. As a result, the controller 150 is able to select, by a row control signal, one the reference cell among the plurality of reference cells 140-11 to 140-1*q* arranged in a row order via the MUX 130-1. For example, during first read operation, the controller 150 selects the reference cell 140-11 by first row control signal. And then, during second read operation, the controller 150 selects the reference cell 140-12 by second row control signal. And then, during $p^{th}$ read operation, the controller 150 selects the reference cell 140-1*q* by $q^{th}$ row control signal. And then, the process may be repeated by selecting the reference cell 140-11 in the next read operation. In other word, simply say that the reference cells 140-11 to 140-1*q* are able to be used sequentially and repeatedly during read operation. Thus, the reference cells 140-11 to 140-1*q* are able to avoid stress or large amount of access in response to read operation, and equality of the reference cells 140-11 to 140-1*q* values are able to be maintained.

In some embodiments of the disclosure, the controller 150 controls the MUX 130-2 to select one of the reference cells 140-21 to 140-2*q* as an selected reference cell to couple to the reference terminal RN2 of the SA 120-2 sequentially and repeatedly in response to each read operation to the at least one memory cell (i.e., memory cells 110-1 to 110-*n*) is performed. The controller 150 generates second row control signal to select one reference cell 140-21 among the plurality of the reference cells 140-21 to 140-2*q* via the selector terminal CN 2 of multiplexer MUX 130-2. As a result, the reference cells 140-21 to 140-2*q* are able to be used sequentially and repeatedly during read operation. Thus, the reference cells 140-21 to 140-2*q* are able to avoid stress or large amount of access in response to read operation, and equality of the reference cells 140-21 to 140-2*q* values are able to be maintained.

In some embodiments of the disclosure, the MUX 130-1 performs canalization from the input terminal of the MUX 130-1 to the output terminal of the MUX 130-1 according to the row control signal from the controller 150. The MUX 130-2 performs canalization from the input terminal of the MUX 130-2 to the output terminal of the MUX 130-2 according to the row control signal from the controller 150. The MUX 130-*n* performs canalization from the input terminal of the MUX 130-*n* to the output terminal of the MUX 130-*n* according to the row control signal from the controller 150. The input terminal of the MUX 130-1 is coupled to the reference cells 140-11 to 140-1*q*. The selector terminal CN 1 of the MUX 130-1, the selector terminal CN 2 of the MUX 130-2, and the selector terminal CN n of the MUX 130-*n* are coupled to the controller 150. The output terminal of the MUX 130-1 is coupled to the input terminal RN1 of the SA 120-1, the output terminal of the MUX 130-2 is coupled to the input terminal RN2 of the SA 120-2, and the output terminal of the MUX 130-*n* is coupled to the input terminal RNn of the SA 120-*n*. On the other hand, the reference terminals RN1 to RNn of the SA 120-1 to 120-*n* are coupled to each other. For example, the reference terminal RN1 of the MUX 130-1 is coupled to the reference terminal RN2 of the MUX 130-2.

By utilizing the row control signal generated by the controller 150, the controller 150 is able to select one reference cell 140-11, 140-21, or 140-2*n* located in the first column of the plurality of the reference cells 140-11 to 140-1*q*, 140-21 to 140-2*q*, or 140-*n*1 to 140-*nq* arranged in a row order. The controller 150 is also able to select more than one reference cells (i.e., 140-11 and 140-21) among the plurality of the reference cells (140-11 to 140-1*q* and 140-21 to 140-2*q*) arranged in a row order. Moreover, the controller 150 has a capability to select the plurality of the reference cells 140-11 to 140-1*q*, 140-21 to 140-2*q*, or 140-*n*1 to 140-*nq* either arranged in a column order, or arranged in a row order, or the combination thereof.

Figure 3:
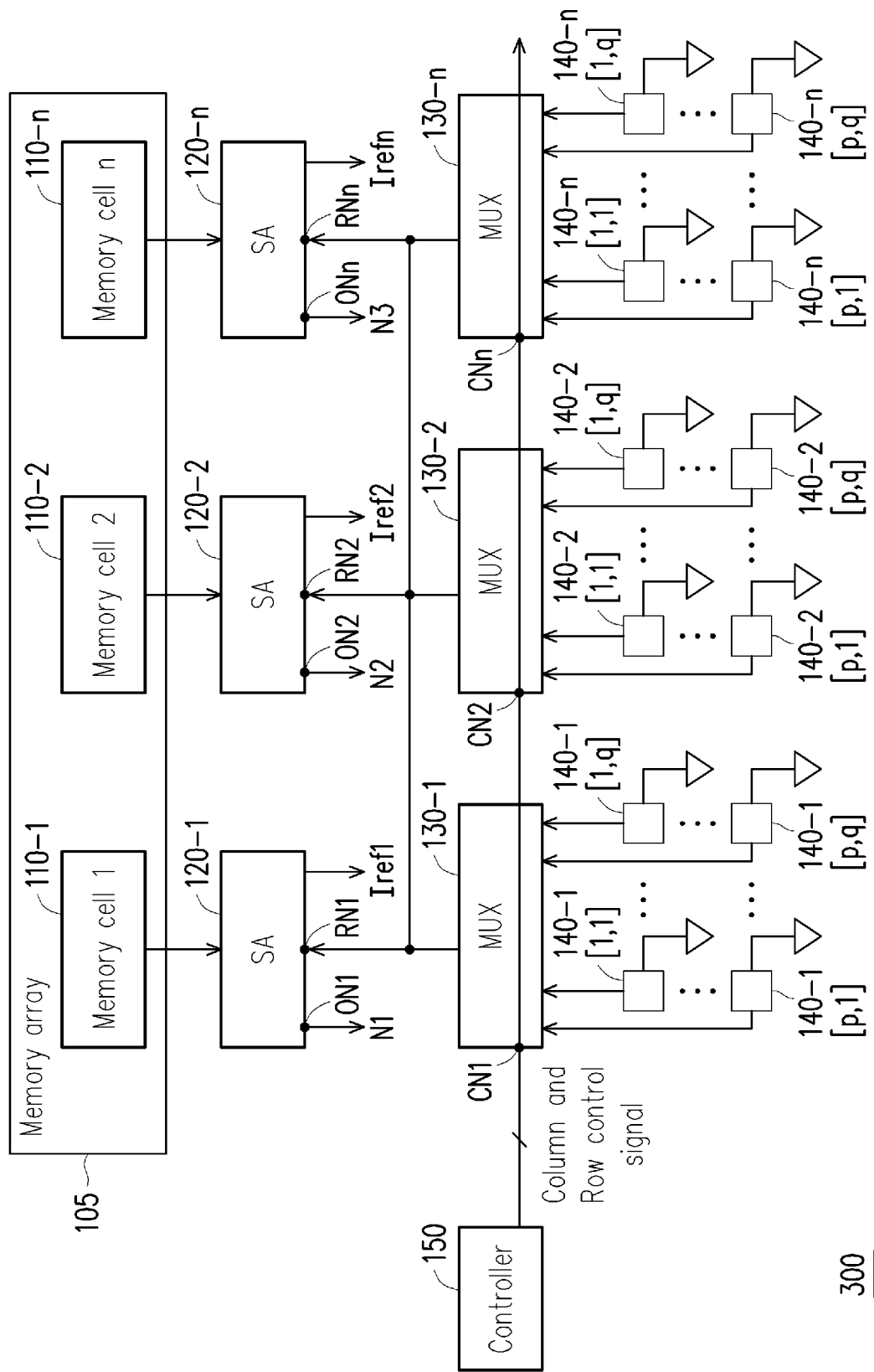
FIG. 3 illustrates a detailed block diagram of a structure of sense amplifier with a plurality of the reference cells selected via a multiplexer by a column control signal and a row control signal generated by a controller according to an embodiment of the disclosure.

FIG. 3 illustrates a detailed block diagram of a structure of sense amplifier with a plurality of the reference cells selected via a multiplexer by the column control signal and the row control signal generated by the controller according to the embodiment of the disclosure.

In the embodiment of FIG. 1, the plurality of the reference cells is arranged in a column. In the embodiment of FIG. 2, the plurality of the reference cells is arranged in a row. In the embodiment of FIG. 3, the plurality of the reference cells is arranged in a matrix form with multiple columns and rows.

In this exemplary embodiment, the controller 150 controls the MUX 130-1 to select one of the reference cells 140-1 [1,1] to 140-1 [p,q] as an selected reference cell to couple to the reference terminal RN1 of the SA 120-1 sequentially and repeatedly in response to each read operation to the at least one memory cell (i.e., memory cells 110-1 to 110-*n*) is performed. The controller 150 may has a plurality of output terminals, each output terminals is coupled to the selector terminal of each multiplexer (i.e., MUX 130-1-MUX 130-*n*). The controller 150 generates at least one column and row control signal to select one reference cell among the plurality of the reference cells arranged in a matrix form with multiple columns and rows. For example, the controller 150 generates first column and row control signal to select one reference cell 140-1 [1,1] among the plurality of the reference cells 140-1 [1,1] to 140-1 [p,q] via the selector terminal CN 1 of multiplexer MUX 130-1. The reference cell 140-1

[1,1] is located in the first row and the first column of the plurality of the reference cells 140-1 [1,1] to 140-1 [p,q] arranged in a matrix form. As a result, the controller 150 is able to select, by a column and row control signal, one the reference cell among the plurality of reference cells 140-1 [1,1] to 140-1 [p,q] arranged in a matrix form via the MUX 130-1. For example, during first read operation, the controller 150 selects the reference cell 140-1 [1,1] by first column and row control signal. And then, during second read operation, the controller 150 selects the reference cell 140-1 [2,1] by second column and row control signal. And then, during $p^{th}$ read operation, the controller 150 selects the reference cell 140-1 [p, 1] by $p^{th}$ column and row control signal. And then, during $(p+1)^{th}$ read operation, the controller 150 selects the reference cell 140-1 [1,2] by $(p+1)^{th}$ column and row control signal. And then, during $(p+2)^{th}$ read operation, the controller 150 selects the reference cell 140-1 [2,2] by $(p+2)^{th}$ column and row control signal. And then, during $(2*p)^{th}$ read operation, the controller 150 selects the reference cell 140-1 [p,2] by $(2*p)^{th}$ column and row control signal. And then, during $((q-1)*p+1)^{th}$ read operation, the controller 150 selects the reference cell 140-1 [1,q] by $((q-1)*p+1)^{th}$ column and row control signal. And then, during $((q-1)*p+2)^{th}$ read operation, the controller 150 selects the reference cell 140-1 [2,q] by $((q-1)*p+2)^{th}$ column and row control signal. And then, during $(q*p)^{th}$ read operation, the controller 150 selects the reference cell 140-1 [p,q] by $(q*p)^{th}$ column and row control signal. And then, the process may be repeated by selecting the reference cell 140-1 [1,1] in the next read operation. In other word, simply say that the reference cells 140-1 [1,1] to 140-1 [p,q] are able to be used sequentially and repeatedly during read operation. Thus, the reference cells 140-1 [1,1] to 140-1 [p,q] are able to avoid stress or large amount of access in response to read operation, and equality of the reference cells 140-1 [1,1] to 140-1 [p,q] values are able to be maintained.

In some embodiments of the disclosure, the controller 150 controls the MUX 130-2 to select one of the reference cells 140-2 [1,1] to 140-2 [p,q] as an selected reference cell to couple to the reference terminal RN2 of the SA 120-2 sequentially and repeatedly in response to each read operation to the at least one memory cell (i.e., memory cells 110-1 to 110-*n*) is performed. The controller 150 generates second column and row control signal to select one reference cell 140-2 [1,1] among the plurality of the reference cells 140-2 [1,1] to 140-2 [p,q] via the selector terminal CN 2 of multiplexer MUX 130-2. As a result, the reference cells 140-2 [1,1] to 140-2 [p,q] are able to be used sequentially and repeatedly during read operation. Thus, the reference cells 140-2 [1,1] to 140-2 [p,q] are able to avoid stress or large amount of access in response to read operation, and equality of the reference cells 140-2 [1,1] to 140-2** [p,q] values are able to be maintained.

In some embodiments of the disclosure, the controller 150 controls the MUX 130-1 to select one of the reference cells 140-1 [1,1] to 140-1 [p,q] as an selected reference cell to couple to the reference terminal RN2 of the SA 120-2 sequentially and repeatedly in response to each read operation to the at least one memory cell (i.e., memory cells 110-1 to 110-*n*) is performed. The controller 150 generates second column and row control signal to select one reference cell 140-1 [1,1] among the plurality of the reference cells 140-1 [1,1] to 140-2 [p,q] via the selector terminal CN 1 of multiplexer MUX 130-1. As a result, the SA 120-2 is able to utilize one reference cell among the plurality of the reference cells 140-1 [1,1] to 140-1 [p,q] via the MUX 130-1** during read operation. In other words, simply say that the SA is able to utilize any one of the reference cells having different column order with the SA.

In some embodiments of the disclosure, the MUX 130-1 performs selection from any one of the input terminals of the MUX 130-1 to the output terminal of the MUX 130-1 according to the column and row control signal from the controller 150. The MUX 130-2 performs selections from any one of the input terminals of the MUX 130-2 to the output terminal of the MUX 130-2 according to the column and row control signal from the controller 150. The MUX 130-*n* performs selection from any one of the input terminals of the MUX 130-*n* to the output terminal of the MUX 130-*n* according to the column and row control signal from the controller 150. The input terminals of the MUX 130-1 is coupled to the reference cells 140-1 [1,1] to 140-1 [p,q]. The selector terminal CN 1 of the MUX 130-1, the selector terminal CN 2 of the MUX 130-2, and the selector terminal CN n of the MUX 130-*n* are coupled to the controller 150. The output terminal of the MUX 130-1 is coupled to the input terminal RN1 of the SA 120-1, the output terminal of the MUX 130-2 is coupled to the input terminal RN2 of the SA 120-2, and the output terminal of the MUX 130-*n* is coupled to the input terminal RNn of the SA 120-*n*. On the other hand, the reference terminals RN1 to RNn of the SA 120-1 to 120-*n* are coupled to each other. For example, the reference terminal RN1 of the MUX 130-1 is coupled to the reference terminal RN2 of the MUX 130-2.

By utilizing the column and row control signal generated by the controller 150, the controller 150 is able to select one reference cell 140-1 [1,1], 140-2 [1,1] or 140-*n* [1,1] located in the first row and the first column of the plurality of the reference cells 140-1 [1,1] to 140-1 [p,q], 140-2 [1,1] to 140-2 [p,q], or 140-*n* [1,1] to 140-*n* [p,q] arranged in a matrix form. The controller 150 is also able to select more than one reference cells (i.e., 140-1 [1,1] and 140-2 [1,1]) among the plurality of the reference cells (140-1 [1,1] to 140-1 [p,q] and 140-2 [1,1] to 140-2 [p,q]) arranged in a matrix form. Moreover, the controller 150 has a capability to select the plurality of the reference cells 140-1 [1,1] to 140-1 [p,q], 140-2 [1,1] to 140-2 [p,q], or 140-*n* [1,1] to 140-*n* [p,q] either arranged in a column order, or arranged in a row order, or arranged in a matrix form with multiple columns and rows.

Figure 4:
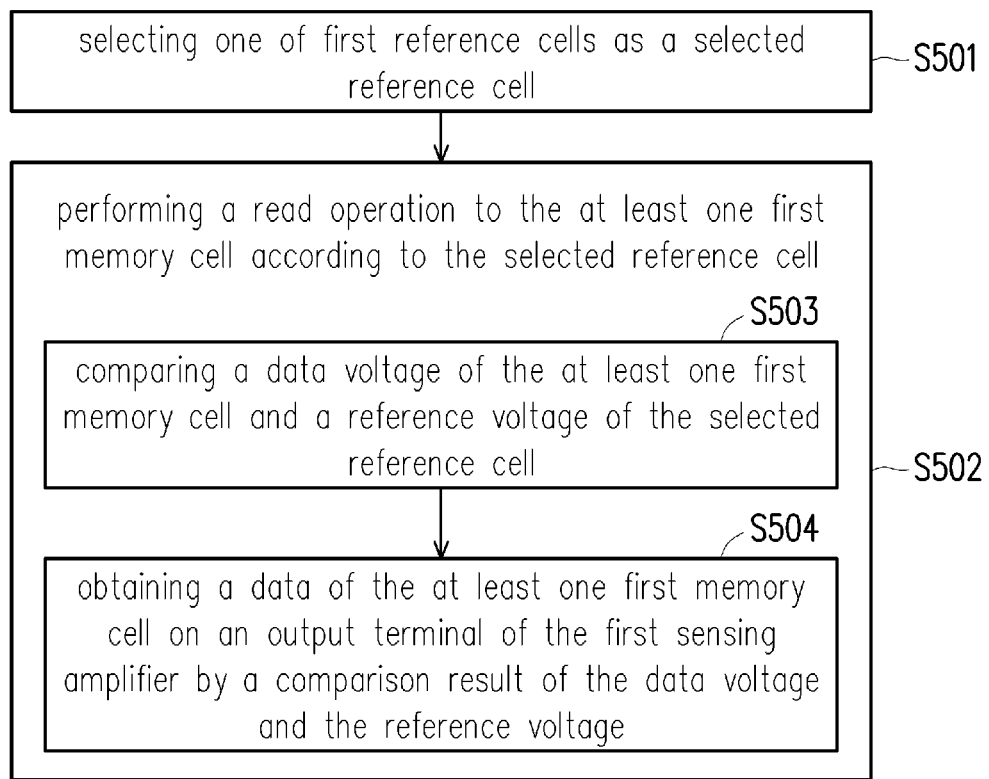
FIG. 4 illustrates a flowchart diagram illustrating steps of a read operation of the at least one memory cell according to an embodiment of the disclosure.

FIG. 4 illustrates a flowchart diagram illustrating steps of a read operation of the at least one memory cell according to the embodiment of the disclosure.

Referring to FIG. 4, the read operation of the at least one memory cell selected from the plurality of the memory cells 110-1 to 110-*n* as shown in FIG. 1 to FIG. 3 may be performed by any one of the SA selected from the plurality of the SAs 120-1 to 120-*n* as shown in FIG. 1 to FIG. 3, but not limited thereto.

In this exemplary embodiment, any one of the SA selected from the plurality of the SAs 120-1 to 120-*n* as shown in FIG. 1 to FIG. 3 and the plurality of reference cells 140-11 to 140-*np* as shown in FIG. 1 or the plurality of reference cells 140-11 to 140-*nq* as shown in FIG. 2 or the plurality of reference cells 140-1 [1,1] to 140-*n* [p,q] as shown in FIG. 3 located in the same column order with the selected SA is set. For example, referring to FIG. 1 and FIG. 4, the controller 150 sets the SA 120-1 and the plurality of the reference cells 140-11 to 140-1*p*. In another embodiment, referring to FIG. 2 and FIG. 4, the controller 150 sets the SA 120-1 and the plurality of the reference cells 140-11 to 140-1*q*. In another embodiment, referring to FIG. 3 and FIG. 4, the controller 150 sets the SA 120-1 and the plurality of the reference cells 140-1 [1,1] to 140-1 [p,q].

In step S501, one reference cell among the plurality of the reference cells 140-11 to 140-*np* as shown in FIG. 1 or among the plurality of reference cells 140-11 to 140-*nq* as shown in FIG. 2 or among the plurality of reference cells 140-1 [1,1] to 140-*n* [p,q] as shown in FIG. 3 is selected by the controller. For example, referring to FIG. 1 and FIG. 4, the controller 150 selects one reference cell 140-11 among the plurality of reference cells 140-11 to 140-1*p* in response to the controller 150 sets the SA 120-1 and the plurality of the reference cells 140-11 to 140-1*p*. In another embodiment, referring to FIG. 2 and FIG. 4, the controller 150 selects one reference cell 140-11 among the plurality of reference cells 140-11 to 140-1*q* in response to the controller 150 sets the SA 120-1 and the plurality of the reference cells 140-11 to 140-1*q*. In another embodiment, referring to FIG. 3 and FIG. 4, the controller 150 selects one reference cell 140-1 [1,1] among the plurality of reference cells 140-1 [1,1] to 140-1 [p,q] in response to the controller 150 sets the SA 120-1 and the plurality of the reference cells 140-1 [1,1] to 140-1 [p,q]. That is, the controller 150 selects one reference cell among the plurality of the reference cells which is located in the same column order with the SA set by the controller 150.

The selected reference cell is passed to the output terminal of the multiplexer. For example, referring to FIG. 1, the selected reference cell 140-11 is passed to the output terminal of the MUX 130-1. Since, the output terminal of the MUX 130-1 is coupled to the reference terminal RN1 of the SA 120-1, the selected reference cell 140-11 is utilized by the SA 120-1 to generate a reference voltage.

In step S502, the one SA among the plurality of the SA 120-1 to 120-*n* reads the at least one memory cell among the plurality of the reference cells 110-1 to 110-*n* according to the selected reference cell among the plurality of the reference cells 140-11 to 140-*np* as shown in FIG. 1 or among the plurality of reference cells 140-11 to 140-*nq* as shown in FIG. 2 or among the plurality of reference cells 140-1 [1,1] to 140-*n* [p,q] as shown in FIG. 3. For example, referring to FIG. 1 and FIG. 4, the SA 120-1 reads the at least one memory cell 110-1 in response to the controller 150 selects the reference cell 140-11 via the MUX 130-1. In another embodiment, the SA 120-1 reads the at least one memory cell 110-1 in response to the controller 150 selects the reference cell 140-21 via the MUX 130-2. In another embodiment, the SA 120-1 reads the at least one memory cell 110-1 in response to the controller 150 selects the reference cell 140-11 via the MUX 130-1 and selects the reference cell 140-21 via the MUX 130-2. That is, the controller 150 performs the step of reading the at least one memory cell according to the one selected reference cell located in the same column order of the at least one memory cell. The controller 150 may performs the step of reading the at least one memory cell according to the one selected reference cell located in the different column order of the at least one memory cell. The controller 150 may performs the step of reading the at least one memory cell according to more than the one selected reference cell located in the arbitrary column order of the at least one memory cell.

The reading process of step S502 may be conducted in two steps (step S503 and step S504). Step S503 is performed by comparing a voltage between a data voltage of the at least one first memory cell and the reference voltage of the selected reference cell. The reference voltage of the selected reference cell may be generated by a current (any one of the currents Iref1 to Irefn) flowing through the reference cell (any one of the reference cells 140-11 to 140-*np*, 140-11 to 140-*nq*, or 140-1 [1,1] to 140-*n* [p,q]).

In step S504, the one SA among the plurality of the SA 120-1 to 120-*n* obtains a data of the at least one memory cell among the plurality of the reference cells 110-1 to 110-*n* on the output terminal of the one SA among the plurality of the SA 120-1 to 120-*n*. The data obtained on the output terminal of the one SA among the plurality of the SA 120-1 to 120-*n* is generated according to the comparison result of the data voltage of the at least one first memory cell and the reference voltage of the selected reference cell. For example, referring to FIG. 1 and FIG. 4, the SA 120-1 obtains the data of the at least one memory cell 110-1 on the output terminal AN1 of the SA 120-1. The process of obtaining the data is conducted by amplifying the difference between the data voltage of the at least one memory cell among the plurality of the reference cells 110-1 to 110-*n* and the reference voltage of the selected reference cell among the plurality of the reference cells 140-11 to 140-*np*, 140-11 to 140-*nq*, or 140-1 [1,1] to 140-*n* [p,q] to the readable data output. The process of the amplification is conducted by any one of the SAs 120-1 to 120-*n* by multiplying the difference between the data voltage of the at least one memory cell among the plurality of the reference cells 110-1 to 110-*n* and the reference voltage of the selected reference cell among the plurality of the reference cells 140-11 to 140-*np*, 140-11 to 140-*nq*, or 140-1 [1,1] to 140-*n* [p,q] with a number of k, in which k is a positive integer. The difference between the data voltage of the at least one memory cell among the plurality of the reference cells 110-1 to 110-*n* and the reference voltage of the selected reference cell among the plurality of the reference cells 140-11 to 140-*np*, 140-11 to 140-*nq*, or 140-1 [1,1] to 140-*n* [p,q] may be a positive value or negative value. The readable data output may be the data output that is able to be read by another hardware circuit inside or outside the memory device 100. The readable data output may be a ±3 volt or a ±5 volt, but not limited thereto.

Based on the above, the structure of the memory device 100 with wear leveling access is designed with the plurality of reference cells 140-11 to 140-*np* as shown in FIG. 1 or the plurality of reference cells 140-11 to 140-*nq* as shown in FIG. 2 or the plurality of reference cells 140-1 [1,1] to 140-*n* [p,q] as shown in FIG. 3. The plurality of the reference cells 140-11 to 140-1*p*, the plurality of the first reference cells 140-11 to 140-1*q*, or the plurality of reference cells 140-1 [1,1] to 140-1 [p,q] may be coupled to the MUX 130-1 coupled to the reference terminal RN1 of the SA 120-1 configured to read the at least the one memory cell 110-1. In another embodiment, the plurality of the reference cells 140-21 to 140-2*p*, the plurality of the first reference cells 140-21 to 140-2*q*, or the plurality of reference cells 140-2 [1,1] to 140-2 [p,q] may be coupled to the MUX 130-2 coupled to the reference terminal RN2 of the SA 120-2 configured to read the at least the one memory cell 110-2. In another embodiment, the plurality of the reference cells 140-21 to 140-2*p*, the plurality of the first reference cells 140-21 to 140-2*q*, or the plurality of reference cells 140-2 [1,1] to 140-2 [p,q] may be coupled to the MUX 130-2 coupled to the reference terminal RN1 of the SA 120-1 configured to read the at least the one memory cell 110-1. In another embodiment, the plurality of the reference cells 140-11 to 140-1*p* and 140-21 to 140-2*p*, the plurality of the first reference cells 140-11 to 140-1*q* and 140-21 to 140-2*q*, or the plurality of reference cells 140-1 [1,1] to 140-1 [p,q] and 140-2 [1,1] to 140-2 [p,q] may be respectively coupled to the MUX 130-1 and the MUX 130-2 coupled to the reference terminal RN1 of the SA 120-1 configured to read the at least the one memory cell 110-1. The reference terminals RN1 to RNn of the SAs 120-1 to 120-*n* are coupled to each other. Each the one reference cell among the plurality of the reference cells 140-21 to 140-2*p*, 140-21 to 140-2*q*, or 140-2 [1,1] to 140-2 [p,q] is selected sequentially and repeatedly when each read operation to at least one memory cell among the plurality of the memory cells 110-1 to 110-*n*. The number of the SA, the MUX, the plurality of reference cells, and the memory cell is not limited to one or two. The number of the SA, the MUX, the plurality of reference cells, and the memory cell may be more than two, but not limited thereto. As a result, by utilizing the above-mentioned structure of the memory device 100, the large number of access to the specific reference cell is able to be reduced. Accordingly, each reference cell is able to be accessed evenly and repeatedly.

According to some embodiments, a memory device is provided. The memory device includes at least one first memory cell, a first sensing amplifier, a first multiplexer circuit, a plurality of first reference cells, and a controller. The first sensing amplifier is coupled to the at least one first memory cell. The first sensing amplifier comprises an output terminal and a reference terminal. The output terminal of the first multiplexer circuit is coupled to the reference terminal of the first sensing amplifier. Each of the first reference cell among the plurality of the first reference cells is coupled to each input node of the first multiplexer circuit. The controller is coupled to a control terminal of the first multiplexer circuit. The controller controls the first multiplexer circuit to select one of the first reference cells as a selected reference cell to couple to the reference terminal of the first sensing amplifier sequentially and repeatedly when each read operation to the at least one first memory cell is performed.

According to some embodiments, the memory device further includes at least one second memory cell, a second sensing amplifier, a second multiplexer circuit, a plurality of second reference cells, and the controller. The second sensing amplifier is coupled to the at least one second memory cell. The second sensing amplifier comprises an output terminal and a reference terminal. The output terminal of the second multiplexer circuit is coupled to the reference terminal of the second sensing amplifier. Each of the second reference cell among the plurality of the second reference cells is coupled to each input node of the second multiplexer circuit. The controller is coupled to a control terminal of the second multiplexer circuit. The controller controls the second multiplexer circuit to select one of the second reference cells as a selected reference cell to couple to the reference terminal of the second sensing amplifier sequentially and repeatedly when each read operation to the at least one second memory cell is performed.

According to some embodiments, the reference terminal of the second sensing amplifier is coupled to the reference terminal of the first sensing amplifier. According to some embodiments, the plurality of the first reference cells is arranged in a column. According to some embodiments, the plurality of the first reference cells is arranged in a row. According to some embodiments, the plurality of the first reference cells is arranged in a matrix with multiple columns and rows. According to some embodiments, the at least one first memory cell is a column of a memory array. According to some embodiments, the first sensing amplifier generates a data of the at least one first memory cell on the output terminal of the first sensing amplifier by comparing a data voltage of the at least one first memory cell and a reference voltage of the selected reference cell.

According to some embodiments, a sensing amplifier is provided. The sensing amplifier is coupled to at least one memory cell. The sensing amplifier with wear leveling of reference cell includes an output terminal and a reference terminal, a multiplexer circuit, and a plurality of reference cells. The output terminal of the multiplexer circuit is coupled to the reference terminal of the sensing amplifier. Each of the reference cell among the plurality of the reference cells is coupled to each input node of the multiplexer circuit. The multiplexer circuit is controlled by a control signal to select one of the first reference cells as a selected reference cell to couple to the reference terminal of the sensing amplifier sequentially and repeatedly when each read operation to the at least one memory cell is performed.

According to some embodiments, the plurality of the reference cells is arranged in a column. According to some embodiments, the plurality of the reference cells is arranged in a row. According to some embodiments, the plurality of the reference cells is arranged in a matrix with multiple columns and rows. According to some embodiments, the at least one memory cell is a column of a memory array. According to some embodiments, the sensing amplifier generates a data of the at least one first memory cell on the output terminal of the sensing amplifier by comparing a data voltage of the at least one memory cell and a reference voltage of the selected reference cell.

According to some embodiments, a method for sensing memory cell is provided. The method for sensing memory cell includes: setting a first sensing amplifier 120-1 and plurality of first reference cells, setting a first sensing amplifier and plurality of first reference cells; performing a read operation to the at least one first memory cell according to the selected reference cell; and, generating a data of the at least one first memory cell on the output terminal of the first sensing amplifier by comparing a data voltage of the at least one first memory cell and a reference voltage of the selected reference cell. The first sensing amplifier comprises an output terminal and a reference terminal.

According to some embodiments, the method for sensing memory cell with wear leveling of reference cell further includes setting a second sensing amplifier and plurality of second reference cells, selecting one of second reference cells as a selected reference cell to couple to the reference terminal of the second sensing amplifier sequentially and repeatedly when each read operation to at least one second memory cell is performed, performing a read operation to the at least one second memory cell according to the selected reference cell, and generating a data of the at least one second memory cell on the output terminal of the second sensing amplifier by comparing a data voltage of the at least one second memory cell and a reference voltage of the selected reference cell. The second sensing amplifier comprises an output terminal and a reference terminal.

According to some embodiments, the reference terminal of the second sensing amplifier is coupled to the reference terminal of the first sensing amplifier. According to some embodiments, the plurality of the first reference cells are arranged in a column, a row, or a matrix with multiple columns and rows. According to some embodiments, the at least one first memory cell is a column of a memory array.

According to some embodiments, the method for sensing memory cell with wear leveling of reference cell further includes selecting another one of second reference cells as the selected reference cell to couple to the reference terminal of the second sensing amplifier sequentially and repeatedly when next read operation to at least one second memory cell is performed.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A sensing amplifier, comprising:
   a sensing amplifier circuit;
   a multiplexer circuit, an output terminal thereof is coupled to the sensing amplifier circuit; and
   a plurality of reference cells having equal value, each of the reference cell is coupled to each input node of the multiplexer circuit,
   wherein the plurality of reference cells are selected sequentially and repeatedly by the multiplexer circuit, and the one of the reference cells is selected as a selected reference cell for coupling to the sensing amplifier circuit in response to each read operation to at least one memory cell is performed,
   wherein the sensing amplifier circuit performs a read operation to the at least one first memory cell according to the selected reference cell comprising:
   the sensing amplifier circuit compares a data voltage of the at least one first memory cell and a reference voltage of the selected reference cell; and
   the sensing amplifier circuit obtains a data of the at least one first memory cell on an output terminal of the sensing amplifier circuit by a comparison result of the data voltage of the at least one first memory cell and the reference voltage of the selected reference cell.

2. The sensing amplifier of claim 1, wherein the sensing amplifier further comprises:
   an output terminal and a reference terminal,
   wherein an output terminal of the multiplexer circuit is coupled to the reference terminal of the sensing amplifier,
   wherein the multiplexer circuit is controlled by a control signal to select one of the reference cells as the selected reference cell to couple to the reference terminal of the sensing amplifier in response to each read operation to the at least one memory cell is performed.

3. The sensing amplifier of claim 1, wherein the plurality of the reference cells is arranged in a column or the plurality of the reference cells is arranged in a row.

4. The sensing amplifier of claim 1, wherein the plurality of the reference cells is arranged in a matrix with multiple columns and rows.

5. The sensing amplifier of claim 1, wherein the at least one memory cell is a column of a memory array.

6. The sensing amplifier of claim 1, wherein the controller controls the sensing amplifier circuit to generate the data of the at least one memory cell on the output terminal of the sensing amplifier by comparing the data voltage of the at least one memory cell and the reference voltage of the selected reference cell.

7. The sensing amplifier of claim 1, further comprising:
   a second sensing amplifier circuit; and
   a plurality of second reference cells having equal value, each of the second reference cell is coupled to each input node of the multiplexer circuit,
   wherein the multiplexer circuit selects one of the second reference cells as the selected reference cell to couple to a reference terminal of the plurality of second sensing amplifier circuit sequentially and repeatedly in response to next read operation to at least one second memory cell is performed.

8. A method for sensing memory cell, comprising:
   selecting one of first reference cells as a selected reference cell to couple to a first sensing amplifier in response to each read operation to at least one first memory cell is performed, wherein each of the first reference cells has equal value; and
   performing a read operation to the at least one first memory cell according to the selected reference cell,
   wherein the first reference cells are selected sequentially and repeatedly, and the one of the first reference cells is selected for coupling to the first sensing amplifier in response to each read operation to at least one memory cell is performed,
   wherein performing the read operation to the at least one first memory cell according to the selected reference cell comprising:
   comparing a data voltage of the at least one first memory cell and a reference voltage of the selected reference cell; and
   obtaining a data of the at least one first memory cell on an output terminal of the first sensing amplifier by a comparison result of the data voltage of the at least one first memory cell and the reference voltage of the selected reference cell.

9. The method of claim 8, further comprising:
   selecting one of second reference cells as a selected reference cell to couple to a second sensing amplifier in response to each read operation to at least one second memory cell is performed; and
   performing a read operation to the at least one second memory cell according to the selected reference cell,
   wherein performing the read operation to the at least one second memory cell according to the selected reference cell comprising:
   comparing a data voltage of the at least one second memory cell and a reference voltage of the selected reference cell; and
   obtaining a data of the at least one second memory cell on an output terminal of the second sensing amplifier by a comparison result of the data voltage of the at least one second memory cell and the reference voltage of the selected reference cell.

10. The method of claim 9, wherein a reference terminal of the second sensing amplifier is coupled to a reference terminal of the first sensing amplifier.

11. The method of claim 8, wherein the plurality of the first reference cells are arranged in a column, a row, or a matrix with multiple columns and rows.

12. The method of claim 9, further comprising:
    selecting another one of second reference cells as the selected reference cell to couple to a reference terminal of the second sensing amplifier sequentially and repeatedly in response to next read operation to at least one second memory cell is performed.

13. A controller of a multiplexer circuit for sensing memory cell,
    wherein the controller is configured to:
    select one of a plurality of first reference cells as a selected reference cell to couple to a first sensing amplifier in response to each read operation to at least one first memory cell is performed, wherein each of the first reference cells has equal value; and perform a read operation to the at least one first memory cell according to the selected reference cell, wherein the first reference cells are selected sequentially and repeatedly, and the one of the first reference cells is selected as a selected reference cell for coupling to the first sensing amplifier in response to each read operation to at least one memory cell is performed, wherein performing a read operation to the at least one first memory cell according to the selected reference cell comprising:

comparing a data voltage of the at least one first memory cell and a reference voltage of the selected reference cell; and obtaining a data of the at least one first memory cell on an output terminal of the first sensing amplifier by a comparison result of the data voltage of the at least one first memory cell and the reference voltage of the selected reference cell.

14. The controller of claim 13, further configured to:

select one of second reference cells as a selected reference cell to couple to a second sensing amplifier in response to each read operation to at least one second memory cell is performed; and perform a read operation to the at least one second memory cell according to the selected reference cell, wherein the controller is configured to performing the read operation to the at least one second memory cell according to the selected reference cell further comprising:

the controller compares a data voltage of the at least one second memory cell and a reference voltage of the selected reference cell; and the controller obtains a data of the at least one second memory cell on an output terminal of the second sensing amplifier by a comparison result of the data voltage of the at least one second memory cell and the reference voltage of the selected reference cell.

15. The controller of claim 14, wherein a reference terminal of the second sensing amplifier is coupled to a reference terminal of the first sensing amplifier.

16. The controller of claim 13, wherein the plurality of the first reference cells are arranged in a column.

17. The controller of claim 13, wherein the plurality of the first reference cells are arranged in a row.

18. The controller of claim 13, wherein the plurality of the first reference cells are arranged in a matrix with multiple columns and rows.

19. The controller of claim 13, wherein the at least one first memory cell is a column of a memory array.

20. The controller of claim 13, wherein the controller controls the first sensing amplifier to generate the data of the at least one first memory cell on an output terminal of the first sensing amplifier by comparing the data voltage of the at least one memory cell and the reference voltage of the selected reference cell.

* * * * *